US010510535B2

(12) United States Patent
Gilet et al.

(10) Patent No.: US 10,510,535 B2
(45) Date of Patent: Dec. 17, 2019

(54) OPTOELECTRONIC DEVICE COMPRISING THREE-DIMENSIONAL SEMICONDUCTOR ELEMENTS, AND METHOD FOR MANUFACTURING SAID DEVICE

(71) Applicants: Aledia, Grenoble (FR); Commissariat à l'Énergie Atomique et aux Énergies Alternatives, Paris (FR); Universite Grenoble Alpes, Saint Martin d'Heres (FR)

(72) Inventors: Philipe Gilet, Teche (FR); Amélie Dussaigne, Saint Hilaire de la Cote (FR); Damien Salomon, Grenoble (FR); Joel Eymery, Sassenage (FR); Christophe Durand, Grenoble (FR)

(73) Assignees: Aledia, Grenoble (FR); Commissariat à l'Énergie Atomique et aux Énergies Alternatives, Paris (FR); Universite Grenoble Alpes, Saint Martin d'Heres (FR)

( * ) Notice: Subject to any disclaimer, the term of this patent is extended or adjusted under 35 U.S.C. 154(b) by 0 days.

(21) Appl. No.: 15/745,429

(22) PCT Filed: Jul. 13, 2016

(86) PCT No.: PCT/FR2016/051818
§ 371 (c)(1),
(2) Date: Jan. 16, 2018

(87) PCT Pub. No.: WO2017/009583
PCT Pub. Date: Jan. 19, 2017

(65) Prior Publication Data
US 2018/0211829 A1    Jul. 26, 2018

(30) Foreign Application Priority Data
Jul. 16, 2015    (FR) ...................... 15 56744

(51) Int. Cl.
*C30B 25/02* (2006.01)
*H01L 21/02* (2006.01)
(Continued)

(52) U.S. Cl.
CPC .......... *H01L 21/0254* (2013.01); *C30B 25/02* (2013.01); *C30B 29/40* (2013.01);
(Continued)

(58) Field of Classification Search
CPC .......... C30B 25/02; C30B 29/56; C30B 22/02
See application file for complete search history.

(56) References Cited

U.S. PATENT DOCUMENTS

2011/0127490 A1* 6/2011 Mi .................... B82Y 10/00
257/13

FOREIGN PATENT DOCUMENTS

EP    2 509 119 A1    10/2012
FR    3 000 613 A1    7/2014
WO   WO 2014/102512 A1   7/2014

OTHER PUBLICATIONS

International Search Report and Written Opinion for Application No. PCT/FR2016/051818 dated Nov. 3, 2016.
(Continued)

*Primary Examiner* — Robert M Kunemund
(74) *Attorney, Agent, or Firm* — Wolf, Greenfield & Sacks, P.C.

(57) ABSTRACT

The invention relates to a method for manufacturing an optoelectronic device (50) including wire-like, conical, or frustoconical semiconductor elements (20) predominantly comprising a III-V compound. Each semiconductor element extends along an axis and includes a portion (54), the side surfaces (55) of which are covered with a shell (56) including at least one active region (31), wherein the portions are created by continuous growth in a reactor, and wherein the
(Continued)

temperature in the reactor varies in an uninterrupted manner from a first temperature value that favors growth of first crystallographic planes perpendicular to said axis, to a second temperature value that is strictly lower than the first temperature value and favors growth of second crystallographic planes parallel to said axis.

12 Claims, 3 Drawing Sheets

(51) Int. Cl.
| | |
|---|---|
| H01L 31/0352 | (2006.01) |
| H01L 31/18 | (2006.01) |
| H01L 33/00 | (2010.01) |
| H01L 33/18 | (2010.01) |
| H01L 33/24 | (2010.01) |
| C30B 29/40 | (2006.01) |
| C30B 29/66 | (2006.01) |
| C30B 29/60 | (2006.01) |
| H01L 33/32 | (2010.01) |
| H01L 27/144 | (2006.01) |
| H01L 27/15 | (2006.01) |

(52) U.S. Cl.
CPC ............ *C30B 29/607* (2013.01); *C30B 29/66* (2013.01); *H01L 21/0262* (2013.01); *H01L 21/02603* (2013.01); *H01L 21/02639* (2013.01); *H01L 31/035227* (2013.01); *H01L 31/035236* (2013.01); *H01L 31/035281* (2013.01); *H01L 31/1856* (2013.01); *H01L 33/0075* (2013.01); *H01L 33/18* (2013.01); *H01L 33/24* (2013.01); *H01L 27/1443* (2013.01); *H01L 27/153* (2013.01); *H01L 33/32* (2013.01); *Y02E 10/544* (2013.01); *Y02P 70/521* (2015.11)

(56) References Cited

OTHER PUBLICATIONS

Bergbauer et al., N-face GaN nanorods: Continuous-flux MOVPE growth and morphological properties. J of Crystal Growth. 2011;315:164-7.

Bougrioua et al., Growth of freestanding GaN using pillar-epitaxial lateral overgrowth from GaN nanocolumns. J of Crystal Growth. 2007;309:113-20.

* cited by examiner

OPTOELECTRONIC DEVICE COMPRISING THREE-DIMENSIONAL SEMICONDUCTOR ELEMENTS, AND METHOD FOR MANUFACTURING SAID DEVICE

CROSS-REFERENCE TO RELATED APPLICATIONS

This application is the national phase of International Application No. PCT/FR2016/051818, filed on Jul. 13, 2016, which claims priority to French Patent Application No. 15/56744, filed on Jul. 16, 2015, both of which applications are incorporated herein by reference to the maximum extent allowable.

BACKGROUND

The present disclosure generally relates to optoelectronic devices comprising three-dimensional semiconductor elements, for example, microwires, nanowires, conical elements, or frustoconical elements, and to methods of manufacturing the same.

Term "optoelectronic devices" is used to designate devices capable of converting an electric signal into an electromagnetic radiation or the other way, and especially devices dedicated to detecting, measuring, or emitting an electromagnetic radiation or devices dedicated to photovoltaic applications.

DISCUSSION OF THE RELATED ART

The improvement of radial-type optoelectronic devices comprising a shell, containing an active area, formed at the periphery of each three-dimensional semiconductor element is here more particularly considered. The active area of the shell is the area having most of the electromagnetic radiation supplied by the shell emitted therefrom or most of the electromagnetic radiation received by the shell captured therein.

The three-dimensional semiconductor elements considered herein comprise a semiconductor material mainly comprising a group-III element and a group-V element (for example, gallium nitride GaN), called III-V compound hereafter. Such devices are for example described in patent application WO2014/102514.

A method of manufacturing an optoelectronic device comprising nanometer-range or micrometer-range semiconductor elements generally comprises growing semiconductor elements and growing a shell covering each semiconductor element. The optoelectronic device may be formed in a reactor. The method generally comprises introducing into the reactor precursor gases of the III-V compound by proportions which favor the growth of each semiconductor element preferentially along an axis, stopping the growth of the semiconductor elements, and modifying the proportions of the precursor gases to promote the forming of the first semiconductor layer of the shell which covers the periphery of the semiconductor element.

Each semiconductor element essentially comprises a stack of crystallographic planes perpendicular to the growth direction of the semiconductor element and the shell particularly comprises a stack of crystallographic planes on the lateral surfaces of the semiconductor element.

A disadvantage is that the lateral surfaces of the semiconductor element having the first semiconductor layer of the shell formed thereon correspond to the edges of the crystallographic planes of the semiconductor element and may be uneven. This may cause the forming of defects in the first semiconductor layer of the shell. Another advantage is that the growth of the semiconductor elements is interrupted before the beginning of the growth of the shells. An accumulation of impurities, present in the reactor, can then be observed on the lateral surfaces of the semiconductor element, which may cause the forming of defects in the shell. Such defects may cause a decrease in the conversion efficiency of the active area.

SUMMARY

Thus, an object of an embodiment is to at least partly overcome the disadvantages of the previously-described methods of manufacturing optoelectronic devices comprising micrometer- or nanometer-range semiconductor elements, particularly semiconductor microwires or nanowires, and of the methods of manufacturing the same.

Another object of an embodiment is to decrease the number of defects in the shell.

Another object of an embodiment is to decrease the lateral bulk of the shell.

Another object of an embodiment is to decrease the duration of the method of manufacturing the semiconductor elements and the shells.

Another object of an embodiment is to be able to manufacture the optoelectronic devices comprising nanometer- or micrometer-range semiconductor elements at an industrial scale and at a low cost.

Thus, an embodiment provides a method of manufacturing an optoelectronic device comprising wire-shaped, conical, or frustoconical semiconductor elements mainly comprising a III-V compound, each semiconductor element extending along an axis and comprising a portion having its lateral surfaces covered with a shell comprising at least one active area, wherein the portions are formed by continuous growth in a reactor and wherein the temperature in the reactor varies, along the continuous growth of the portions, uninterruptedly from a first temperature value which promotes the growth of first crystallographic planes perpendicular to said axis to a second temperature value, lower than the first temperature value, which promotes the growth of second crystallographic planes parallel to said axis.

According to an embodiment, the first temperature value is higher than 1,000° C. and the second temperature value is lower than 950° C.

According to an embodiment, the second temperature value is lower than 750° C.

According to an embodiment, a precursor gas of the group-V element and a precursor gas of the group-III element are injected into the reactor and the ratio of the flow of the precursor gas of the group-V element to the flow of the precursor gas of the group-III element, called V/III ratio, varies from a first value of the V/III ratio to a second value of the V/III ratio greater than the first value of the V/III ratio.

According to an embodiment, the first value of the V/III ratio is smaller than 300, preferably smaller than 200, and the second value of the V/III ratio is greater than 500, preferably greater than 1,000.

According to an embodiment, the pressure in the reactor is taken, along the continuous growth of the portions, from a first pressure value to a second pressure value lower than the first pressure value.

According to an embodiment, the first pressure value is higher than 53 kPa, preferably higher than 67 kPa, and the second pressure value is lower than 40 kPa, preferably lower than 27 kPa.

According to an embodiment, hydrogen and nitrogen are injected into the reactor and the ratio of the hydrogen flow to the nitrogen flow, called H2/N2 ratio, varies from a first value of the H2/N2 ratio to a second value of the H2/N2 ratio greater than the first value of the H2/N2 ratio.

According to an embodiment, the first value of the H2/N2 ratio is smaller than 40/60, preferably smaller than 30/70, and the second value of the H2/N2 ratio is greater than 60/40, preferably greater than 70/30.

According to an embodiment, the active areas are the areas having most the radiation supplied by the optoelectronic device emitted therefrom or having most the radiation received by the optoelectronic device captured therein.

According to an embodiment, the III-V compound is a III-N compound, particularly selected from the group comprising gallium nitride, aluminum nitride, indium nitride, gallium indium nitride, gallium aluminum nitride, aluminum indium nitride, and gallium aluminum indium nitride.

Another embodiment provides an optoelectronic device comprising wire-shaped, conical, or frustoconical elements mainly comprising a III-V compound, each semiconductor element extending along an axis and comprising a monoblock portion having its lateral surfaces covered with a shell comprising at least one active area, the portion comprising a base mainly comprising first crystallographic planes perpendicular to said axis, the portion further comprising second crystallographic planes parallel to said axis at the level of the lateral surfaces.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for biasing the optoelectronic device are well known and will not be described. In the following description, unless otherwise indicated, terms "substantially", "approximately", and "in the order of" mean "to within 10%".

The present description relates to optoelectronic devices comprising three-dimensional elements, for example, microwires, nanowires, conical elements, or frustoconical elements. In the following description, embodiments are described for optoelectronic devices comprising microwires or nanowires. However, such embodiments may be implemented for three-dimensional elements other than microwires or nanowires, for example, pyramid-shaped three-dimensional elements.

Term "microwire", "nanowire", "conical element", or "frustoconical element" designates a three-dimensional structure having a shape elongated along a preferred direction, having at least two dimensions, called minor dimensions, in the range from 5 nm to 2.5 μm, preferably from 50 nm to 2.5 μm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 μm, preferably in the range from 100 nm to 1 μm, more preferably from 100 nm to 800 nm. In certain embodiments, the height of each microwire or nanowire may be greater than or equal to 500 nm, preferably in the range from 1 μm to 50 μm.

In the following description, term "wire" is used to mean "microwire" or "nanowire". Preferably, the median line of the wire which runs through the centers of gravity of the cross-sections, in planes perpendicular to the preferred direction of the wire, is substantially rectilinear and is called "axis" of the wire hereafter.

In the following description, embodiments will be described in the case of an optoelectronic device comprising light-emitting diodes. It should however be clear that these embodiments may concern other applications, particularly devices dedicated to electromagnetic radiation detection or measurement or devices dedicated to photovoltaic applications.

Figure 1:
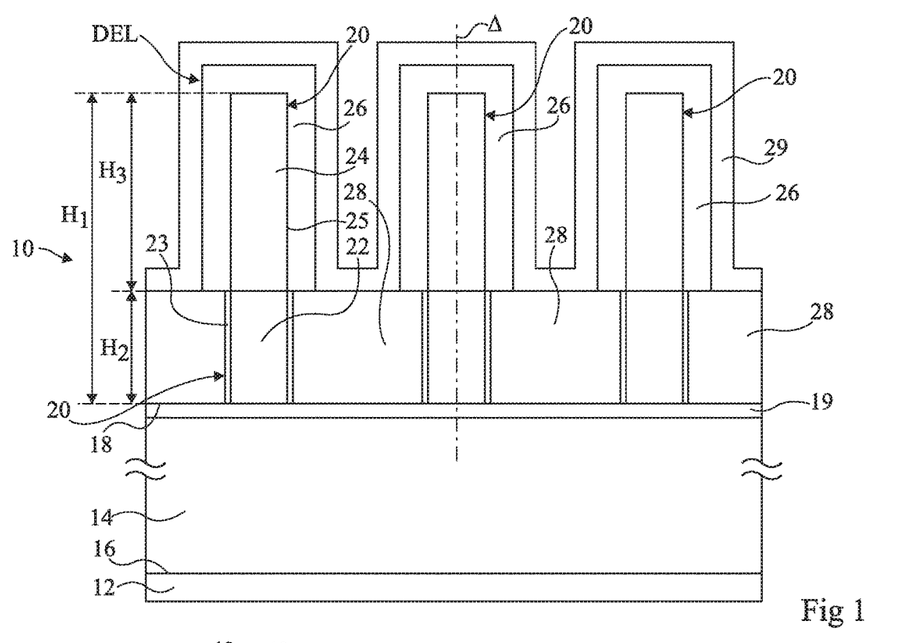
FIG. 1 is a partial simplified cross-section view of an example of an optoelectronic device comprising microwires or nanowires.

FIG. 1 is a partial simplified cross-section view of an optoelectronic device 10 formed from wires such as previously described and capable of emitting an electromagnetic radiation.

Device 10 comprises, from bottom to top in FIG. 1:

a first biasing electrode 12;

a substrate 14, for example, semiconductor, comprising parallel surfaces 16 and 18, surface 16 being in contact with electrode 12 and surface 18 being treated to promote the growth of wires in organized fashion, particularly in one of the above-described manners. This treatment is schematically shown in FIG. 1 by a region 19 at the surface of substrate 14;

wires 20 having an axis Δ (three wires being shown), a height H1, each wire comprising a lower portion 22 of height H2, in contact with surface 18, and an upper portion 24 of height H3;

a passivation layer 23 covering the periphery of each lower portion 22;

a shell 26 covering each upper portion 24;

insulating portions 28 covering surface 18 between wires 20 at least up to height H2; and a second electrode layer 29 covering shells 26 and insulating portions 28.

Each wire 20 is made of a semiconductor material mainly comprising a III-V compound, for example, GaN.

The assembly formed by each wire 20 and the associated shell 26 forms a light-emitting diode DEL. Shell 26 particularly comprises an active area, which is the layer having most of the electromagnetic radiation delivered by light-emitting diode DEL emitted therefrom. Light-emitting diodes DEL may be connected in parallel and form an assembly of light-emitting diodes. The assembly may comprise from a few light-emitting diodes DEL to some thousand light-emitting diodes.

Figure 2:
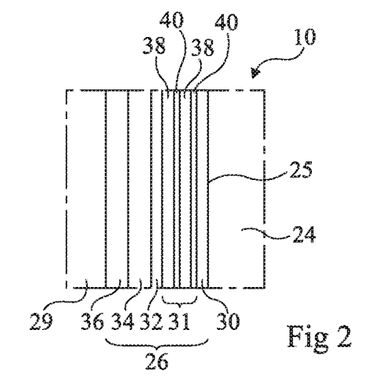
FIG. 2 is an enlarged partial simplified view of a portion of the optoelectronic device of FIG. 1.

FIG. 2 is an enlarged view of shell 26. Shell 26 may comprise a stack of a plurality of semiconductor layers particularly comprising:

a spacer layer 30, for example, made of GaN, covering upper portion 24 of wire 20;
an active area 31 covering spacer layer 30;
possibly, a barrier layer 32 covering active area 31;
an intermediate layer 34 having a conductivity type opposite to that of lower portion 22 of wire 20 covering barrier layer 32; and
a bonding layer 36 covering intermediate layer 34 and covered with electrode 29.

Spacer layer 30 is preferably a layer made of the same semiconductor material as upper portion 24 of wire 20 or of an alloy of GaInN or AlGaN or AlGaInN type. Spacer layer 30 is provided to provide a surface having properties appropriate for the growth of active area 31. The thickness of spacer layer 30 may be in the range from 5 nm to 5 μm, preferably from 10 nm to 2,000 nm.

Active area 31 is the area having most of the radiation delivered by light-emitting diode DEL emitted therefrom. According to an example, active area 31 may comprise confinement means, such as multiple quantum wells. It is for example formed of an alternation of GaN layers 38 and of InGaN layers 40, two GaN layer 38 and two InGaN layers 40 being shown as an example in FIG. 2. GaN layers 38 may be doped, for example, of type N or P, or non-doped. According to another example, active area 31 may comprise a single quantum well comprising a single InGaN layer, for example, having a thickness greater than 10 nm between two GaN layers.

According to an example of a method of manufacturing optoelectronic device 10, the upper portion 24 of each wire 20 may be formed in a metal-organic chemical vapor deposition (MOCVD) reactor. The growth conditions in the reactor are adapted to promote the preferential growth of each wire 20 along its axis Δ. This means that the growth speed of wire 20 along axis Δ is much larger, preferably by at least one order of magnitude, than the growth speed of wire 20 along a direction perpendicular to axis Δ. As an example, the method of growing wires 20 may comprise injecting into a reactor a precursor of a group-III element and a precursor of a group-V element.

Once the upper portion 24 of each wire 20 has been formed, the flows of precursor gases of the group-III element and of the group-V element are interrupted. The reactor is then supplied again with precursor gases of the group-III element and of the group-V element with flows adapted to promote a growth of the III-V compound, particularly on lateral surfaces 25 of upper portion 24 to form spacer layer 30 of shell 26. This means that the speed of growth of the III-V compound along a direction perpendicular to axis Δ is greater than or equal to the speed of growth of the III-V compound along a direction parallel to axis Δ.

Figure 3:
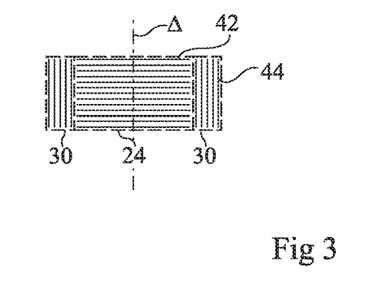
FIG. 3 schematically shows the stack of crystallographic planes at the interface between the semiconductor element and the shell of the optoelectronic device of FIG. 2.

FIG. 3 shows an enlarged cross-section view of the interface between the upper portion 24 of wire 20 and spacer layer 30 in the case where a MOCVD growth has been implemented. During the MOCVD growth, the species which arrive at the surface arrange themselves and bond to one another so as to form the desired material. The growth conditions are adapted to promote a growth atomic plane by atomic plane, that is, preferably, the species which reach the surface will "complete the plane" or fill the "holes" of the plane before starting the next crystalline plane. It is then spoken of a 2D growth. FIG. 3 very schematically shows crystallographic planes 42 of growth of upper portion 24 of wire 20 and crystallographic planes 44 of growth of spacer layer 30 of shell 26. In portion 24, the growth planes are perpendicular to axis Δ and in spacer layer 30, growth planes 30 are parallel to axis Δ.

A disadvantage is that crystallographic growth planes 44 are formed on the edges of crystallographic growth planes 42. This may cause the occurrence of defects in spacer layer 30. Another disadvantage is that, at the end of the growth of upper portion 24, the flows of precursor gases of the group-III element and of the group-V element are momentarily interrupted. During the time of interruption of the precursor gases, an accumulation of impurities can be observed on the lateral surfaces of upper portion 24 of wire 20. This may also cause the occurrence of defects in spacer layer 30. It is then necessary for spacer layer 30 to be sufficiently thick to prevent the propagation of defects to active area 31, which would cause a decrease in the quantum efficiency of active area 31.

Figure 4:
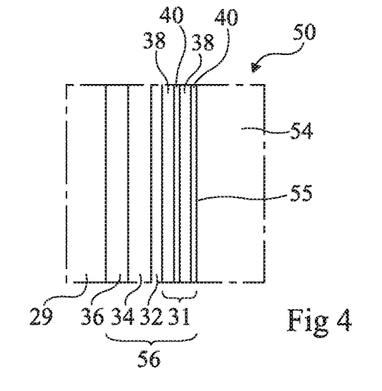
FIG. 4 is a view similar to FIG. 2 of an embodiment of an optoelectronic device.

FIG. 4 is a view similar to FIG. 2 of an embodiment of an optoelectronic device 50. Optoelectronic device 50 comprises all the elements of optoelectronic device 10 shown in FIG. 1, with the difference that upper portion 24 of each wire 20 is replaced with a monoblock upper portion 54 and that shell 26 is replaced with a shell 56. Shell 56 comprises all the elements of shell 26, with the difference that spacer layer 30 is not present. Upper portion 54 has substantially the same composition as upper portion 24. However, lateral surface 55 of upper portion 54 has crystallographic properties adapted to the growth of active area 31. The composition of upper portion 54 is substantially uniform. Preferably, the composition of upper portion 54 is uniform.

Even though the width, measured along a direction perpendicular to axis Δ, of upper portion 54 may be greater than the width of upper portion 24, the total width, measured along a direction perpendicular to axis Δ, of the assembly of shell 56 and of upper portion 54 may advantageously be smaller than the width of the assembly of shell 26 and of upper portion 24. The density of light-emitting diodes of optoelectronic device 50 can then be increased with respect to optoelectronic device 10 and the total light power emitted by optoelectronic device 50 can be increased with respect to optoelectronic device 10.

Figure 5:
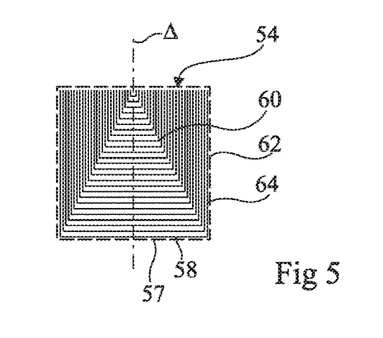
FIG. 5 very schematically shows the stack of crystallographic planes of growth of the semiconductor element of the optoelectronic device of FIG. 4.

FIG. 5 is a view similar to FIG. 3 of upper portion 54 where the crystal orientation of the material along its growth has been schematically shown. Upper portion 54 comprises a base 57 where crystallographic planes 58 are perpendicular to axis Δ, an intermediate region 60, resting on base 57, where the material simultaneously grows parallel to axis Δ and perpendicularly to axis, and a peripheral region 62, located around base 57 and intermediate region 60, where the crystallographic planes 64 are perpendicular to axis Δ. As an example, in the case of GaN wires 20 of N polarity, crystallographic planes 58 correspond to −c polar planes and crystallographic planes 64 correspond to (1-100) crystal planes, called non polar.

According to an embodiment, base 57 is obtained by adapting the flows of precursor gases of the group-V element and of the group-III element to promote the preferential growth of wire 20 along axis Δ. Peripheral region 62 is for example obtained by decreasing the growth temperature to a value lower than approximately 980° C., preferably lower than 950° C. in the case of the growth of a material of GaN or GaAlN type and to temperatures lower than 750° C. for a material of InGaN type and by adapting the flows of the precursor gases of the group-V element and of the group-III element to promote the preferential growth of wire 20 perpendicularly to axis Δ. Intermediate region 60 is obtained by modifying with no interruption the flows of precursor gases of the group-V element and of the group-III element from values which are favorable to the preferential growth of wire 20 along axis Δ to values which correspond to those used to promote the growth of spacer layer 30 of optoelectronic device 10.

FIGS. 6A to 6D are partial simplified cross-section views of the structures obtained at successive steps of another embodiment of a method of manufacturing the optoelectronic device of FIG. 50 shown in FIG. 4.

Figure 6A:
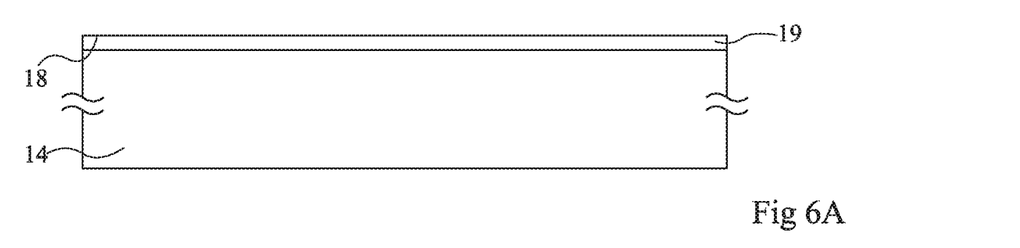
FIGS. 6A to 6D are partial simplified cross-section views of the structures obtained at successive steps of another embodiment of a method of manufacturing the optoelectronic device of FIG. 4.

FIG. 6A shows the structure obtained after the treatment of substrate 14 to promote the growth of wires of the III-V compound, for example, GaN, at preferred locations. The treatment is schematically shown by the forming of seed layer 19 at the surface of substrate 14. The treatment step may be omitted. In this case, the wires may spontaneously grow on substrate 14.

Substrate 14 may correspond to a monoblock structure or correspond to a layer covering a support made of another material. Substrate 14 is preferably a semiconductor substrate, for example, a substrate made of silicon, of germanium, of silicon carbide, of a III-V compound, such as GaN or GaAs, or a ZnO substrate. Preferably, substrate 14 is a single-crystal silicon substrate. Preferably, it is a semiconductor substrate compatible with manufacturing methods implemented in microelectronics. Substrate 14 may correspond to a multilayer structure of silicon-on-insulator type, also called SOI. In this case, electrode 12 may be formed on the side of surface 18 of substrate 14. Substrate 14 may be heavily doped, lightly-doped, or non-doped.

The treatment applied to the substrate to promote the wire growth may correspond to one of the treatments described in documents U.S. Pat. No. 7,829,443, FR 2 995 729, or FR 2 997 558.

Figure 6B:
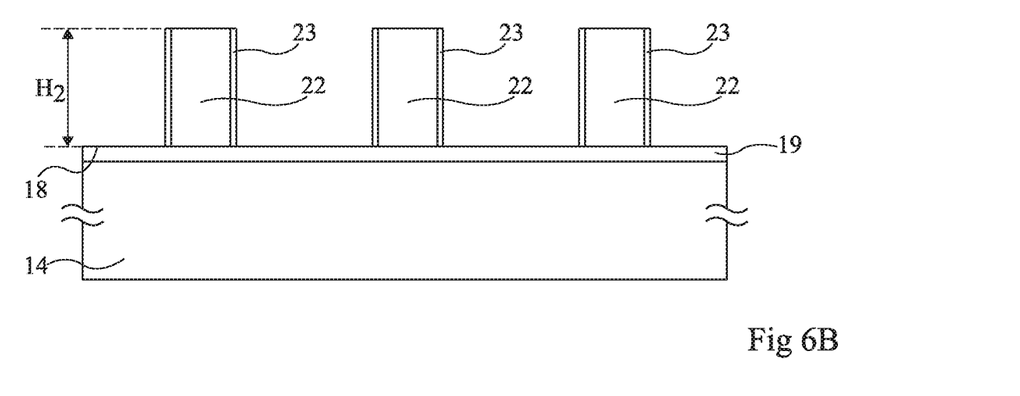

FIG. 6B shows the structure obtained after the growth of the passivated portion 22 of each wire 20 up to height H2 from surface 18 of substrate 14.

Wires 20 may be at least partly made up of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Saying that a compound based on at least a first element and on a second element has a polarity of the first element or a polarity of the second element means that the material grows along a preferential direction and that when the material is cut in a plane perpendicular to the preferred growth direction, the exposed surface essentially comprises atoms of the first element in the case of the polarity of the first element or atoms of the second element in the case of the polarity of the second element. Wires 20 may have a nitrogen polarity or a gallium polarity.

Wires 20 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

Height H1 of each wire 20 may be in the range from 250 nm to 50 μm. Each wire 20 may have a semiconductor structure elongated along an axis substantially perpendicular to surface 18. Each wire 20 may have a generally cylindrical shape (for example, hexagonal). The axes of two adjacent wires 20 may be distant by from 0.5 μm to 10 μm and preferably from 1.5 μm to 4 μm. As an example, wires 20 may be regularly distributed, particularly in a hexagonal network.

The cross-section of wires 20 may have different shapes, such as, for example, an oval, circular, or polygonal shape, particularly triangular, rectangular, square, or hexagonal. It should thus be understood that term "diameter" or "average diameter" in a cross-section of a wire or of a layer deposited on this wire designates a quantity associated with the surface of the targeted structure in this cross-section, for example corresponding to the diameter of the disk having the same surface area as the cross-section of the wire. The average diameter of each wire 20 may be in the range from 50 nm to 2.5 μm.

The wire growth method may be a method such as metal-organic chemical vapor deposition (MOCVD), also known as metal-organic vapor phase epitaxy (MOVPE).

When the wires are mainly made of a III-V compound, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia (NH3), tertiary-butylphosphine (TBP), arsine (AsH3), or dimethylhydrazine (UDMH).

According to an embodiment of the invention, in the case of a wire having a nitrogen polarity, a first phase of growth of lower portion 22 of wire 20, a precursor of an additional element is added in excess, in addition to the precursors of the III-V compound. The additional element may be silicon (Si). An example of a precursor of silicon is silane (SiH4). The presence of the precursor of the additional element results in incorporating the additional element in the III-V compound to dope this III-V compound, but also in the forming of layer 23 of a dielectric material mainly formed of the additional element and of the group-V element on the lateral sides of the growing crystals of the III-V compound. The concentration of the additional element in the III-V compound is in the range from 1018 to 1021 atoms/cm3, for example, in the order of 1020 atoms/cm3. Layer 23 of the dielectric material has a thickness in the range from one atom monolayer to 10 nm. In the case where the III-V compound is GaN and the additional element is silicon, the GaN is heavily N-type doped and will here be called n+GaN and layer 23 of dielectric material is silicon nitride SiN, of general formula $Si_xN_y$, where x and y are numbers between 1 and 4, for example, in stoichiometric form $Si_3N_4$.

As an example, the manufacturing method described in patent application WO2012136665 may be implemented. As an example, in the case where upper portion 22 is made of n+GaN, a MOCVD-type method may be implemented by injecting into a MOCVD reactor, of shower type, a gallium precursor gas, for example, trimethylgallium (TMGa) and a nitrogen precursor gas, for example, ammonia (NH3). As an example, a showerhead-type 3×2" MOCVD reactor commercialized by AIXTRON, may be used. A molecular flow ratio between trimethylgallium and ammonia within the 5-200 range, preferably within the 10-100 range, enables to promote the growth of wires. As an example, a carrier gas which ensures the diffusion of metal-organic elements all the way into the reactor becomes laden with metal-organic elements in a TMGa bubbler. The latter is adjusted according to the standard operating conditions. A flow of 60 sccm (standard cubic centimeters per minute) is for example selected for TMGa, while a 300-sccm flow is used for NH3 (standard NH3 bottle). A pressure of approximately 800 mbar (800 hPa) is used. The gaseous mixture further comprises silane injected into the MOCVD reactor, which material is a precursor of silicon. The silane may be diluted in hydrogen at 1,000 ppm and a 20-sccm flow is provided. The temperature in the reactor is for example in the range from 950° C. to 1,100° C., preferably from 990° C. to 1,060° C. To transport species from the outlet of the bubblers to the two reactor plenums, a 2,000-sccm flow of carrier gas, for example, N2, distributed between the two plenums, is used.

Figure 6C:
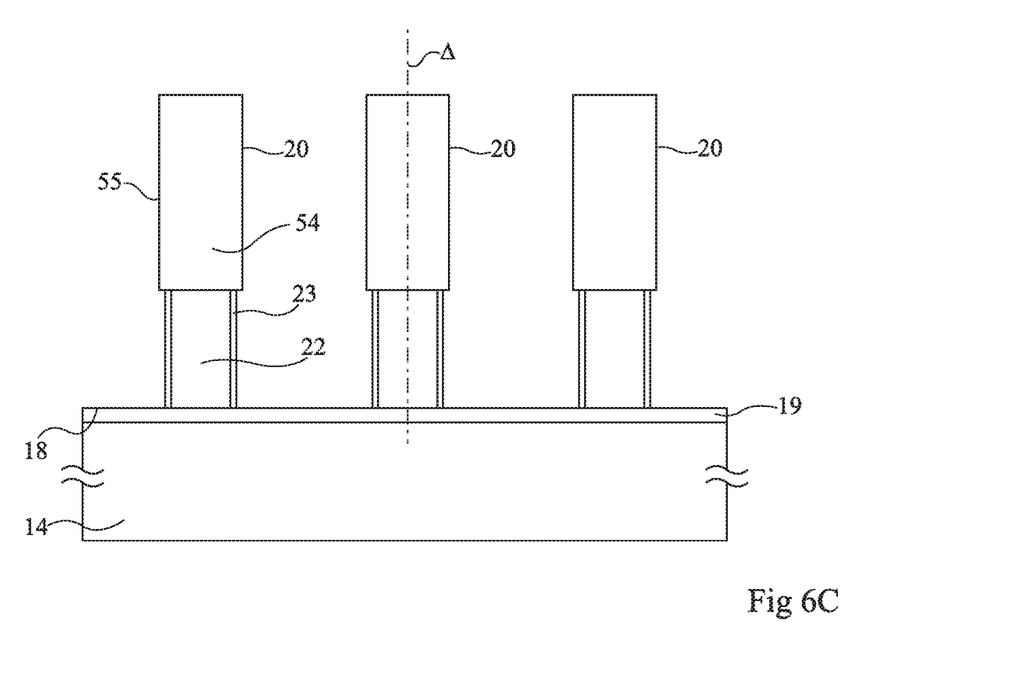

FIG. 6C shows the structure obtained after the forming of upper portion 54 of each wire 20 from the top of lower portion 22.

According to an embodiment, during the growth of upper portion 54 of wire 20, the operating conditions of the MOCVD reactor are continuously or gradually modified to pass from initial conditions promoting the growth of the material forming upper portion 54 along axis Δ of wire 20, to final conditions promoting the growth of the material forming upper portion 54 perpendicular to lateral surfaces 55 of upper portion 54.

According to an embodiment, during the growth of upper portion 54 of wire 20, the growth temperature is continuously lowered to pass from conditions favorable to the growth along axis Δ to conditions favorable to the growth perpendicular to axis Δ. In the case of the growth of GaN or GaAlN, the initial temperature is higher than 1,000° C. and the final temperature is approximately 980° C., preferably 950° C. In the case of GaInN-type materials, the initial temperature is higher than 750° C. and the final temperature is lower than 730° C.

According to an embodiment, the initial conditions may be the operating conditions of the MOCVD reactor previously described for the forming of lower portions 22, but for the fact that the silane flow in the reactor is decreased, for example, by a factor greater than or equal to 10, or stopped. Even when the silane flow is stopped, an upper portion 54 may be N-type doped due to the diffusion in this portion of dopants originating from the adjacent passivated portions 22 or due to the residual doping of GaN.

According to an embodiment, the ratio of the molar flow of the group-V element to the molar flow of the group-III element, or V/III ratio, in the initial conditions is smaller than or equal to 300, preferably smaller than or equal to 200. According to an embodiment, the V/III ratio in the final conditions is greater than or equal to 500, preferably greater than or equal to 1,000, more preferably greater than or equal to 5,000.

According to an embodiment, the pressure in the reactor in the initial conditions is higher than or equal to 400 Torr (approximately 53 kPa), preferably higher than or equal to 500 Torr (approximately 67 kPa). According to an embodiment, the pressure in the reactor in the final conditions is lower than or equal to 300 Torr (approximately 40 kPa), preferably higher than or equal to 200 Torr (approximately 27 kPa).

According to an embodiment, the ratio of the H2 flow to the N2 flow, called H2/N2 ratio, in the reactor in the initial conditions is smaller than or equal to 40/60, preferably smaller than or equal to 30/70. According to an embodiment, the H2/N2 ratio in the final conditions is greater than or equal to 60/40, preferably greater than or equal to 70/30.

According to an embodiment, at least one of the parameters selected from the V/III ratio, the pressure in the reactor, and the H2/N2 ratio is continuously or gradually modified to pass from the initial conditions to the final conditions. According to an embodiment, the V/III ratio, the pressure in the reactor, and/or the H2/N2 ratio may each vary linearly between the initial values and the final values.

As a variation, in the case where active area 31 comprises at least one layer of a ternary semiconductor material, comprising, for example, in addition to the III-V compound of upper portion 54, an additional group-III element, for example, indium, a precursor gas of this additional element may be introduced into the reactor during the growth of upper portion 54.

Figure 6D:
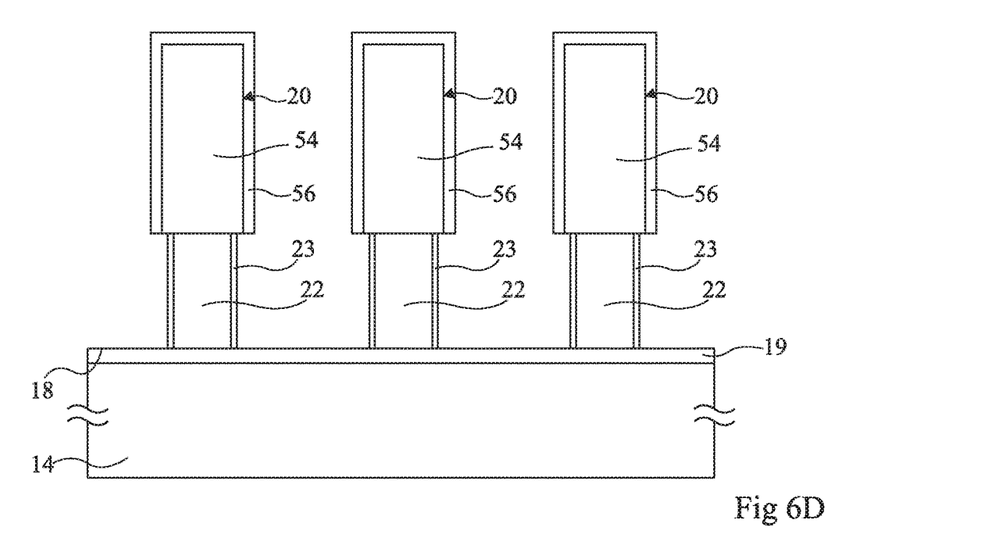

FIG. 6D shows the structure obtained after having formed by epitaxy the semiconductor layers of shell 56. Given the presence of passivation layer 23 on lower portion 22, the deposition of the semiconductor layers of shell 56 only occurs on upper portion 54.

Among the layers of shell 56, electron barrier layer 32 may be formed of a ternary alloy, for example, aluminum gallium nitride (AlGaN) or aluminum indium nitride (AlInN) in contact with active layer 31 and intermediate layer 34, to provide a good distribution of electric carriers in active layer 31.

Intermediate layer 34, for example, P-type doped, may correspond to a semiconductor layer or to a stack of semiconductor layers and enables to form a P-N or P-I-N junction, the active layer being located between the intermediate P-type layer and the upper N-type portion of wire 20 of the P-N or P-I-N junction.

Bonding layer 36 may correspond to a semiconductor layer or to a stack of semiconductor layers and enables to form an ohmic contact between the intermediate layer and electrode 29. As an example, the bonding layer may be very heavily doped, with a doping type opposite to that of the lower portion of wire 20, until the semiconductor layer(s) are degenerated, for example, P-type doped at a concentration greater than or equal to 1020 atoms/cm3.

The final steps of the embodiment of the manufacturing method comprise forming insulating portions 28 and electrodes 12 and 29. Insulating portion 28 may be made of a dielectric material, for example, silicon oxide (SiO2).

Electrode 29 is capable of biasing the active layer of each wire 20 and of giving way to the electromagnetic radiation emitted by light-emitting diodes DEL. The material forming electrode 29 may be a transparent and conductive material such as indium tin oxide (ITO), aluminum zinc oxide, or graphene. As an example, electrode layer 29 has a thickness in the range from 5 nm to 200 nm, preferably from 20 nm to 50 nm.

As a variation, an encapsulation layer, not shown, covering electrode layer 29 may be provided. The encapsulation layer is made of an at least partially transparent insulating material. The encapsulation layer may be made of a transparent inorganic material, for example, a silicon oxide or aluminum oxide, or of an at least partly transparent organic material, for example, a silicone polymer, an epoxy polymer, an acrylic polymer, or a polycarbonate. As a variation, a conductive mirror layer, not shown, covering electrode layer 29 between wires 20 without extending on wires 20, may be provided. The conductive mirror layer may correspond to a metal layer, for example, made of aluminum, of silver, of copper, or of zinc. According to another variation, the optoelectronic device may further comprise a phosphor layer, not shown.

The way in which the V/III ratio, the pressure, and/or the H2/N2 ratio varies between the initial conditions and the final conditions determines the outer shape of upper portion 54 of wire 20.

In FIG. 6C, the upper portion 54 of each wire 20 is shown as being substantially wire-shaped.

Figure 7:
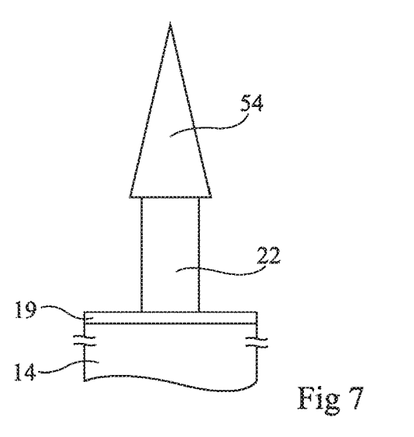
FIGS. 7 to 10 are partial simplified cross-section views of other embodiments of optoelectronic devices.
Figure 8:
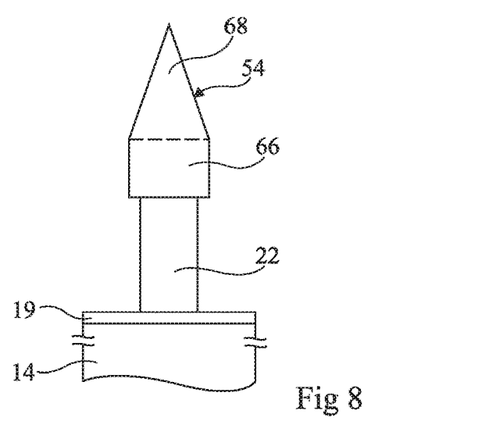

FIGS. 7 and 8 show other embodiments of portion 54 in the case where portion 54 has the gallium polarity.

In FIG. 7, upper portion 54 of each wire 20 has a conical shape.

In FIG. 8, the upper portion 54 of each wire 20 comprises a first wire portion 66 which extends from the top of lower portion 22 and which is continued by a conical portion 68.

Figure 9:
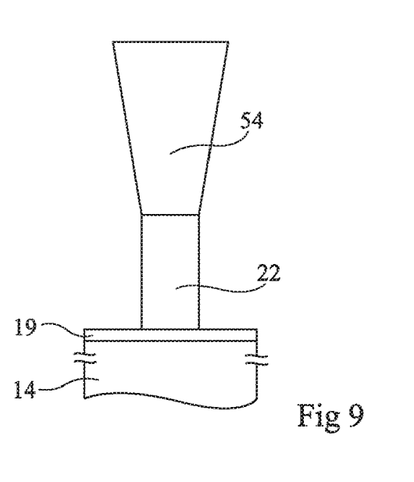
Figure 10:
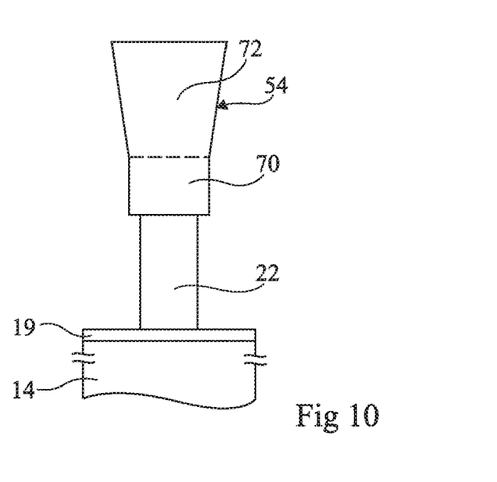

FIGS. 9 and 10 show other embodiments of portion 54 in the case where portion 54 has the nitrogen polarity.

In FIG. 9, the upper portion 54 of each wire may have a reverse frustoconical shape.

In FIG. 10, upper portion 54 of each wire 20 comprises a first wire portion 70 which extends from the top of lower portion 22 and which extends in an inverted frustoconical portion 72.

The invention claimed is:

1. A method of manufacturing an optoelectronic device comprising wire-shaped, conical, or frustoconical semiconductor elements mainly comprising a III-V compound, each semiconductor element extending along an axis and comprising a portion having its lateral surfaces covered with a shell comprising at least one active area, wherein the portions are formed by continuous growth in a reactor and wherein the temperature in the reactor varies, along the continuous growth of the portions, uninterruptedly from a first temperature value which promotes the growth of first crystallographic planes perpendicular to said axis to a second temperature value, lower than the first temperature value, which promotes the growth of second crystallographic planes parallel to said axis.

2. The method of claim 1, wherein the first temperature value is higher than 1,000° C. and the second temperature value is lower than 950° C.

3. The method of claim 2, wherein the second temperature value is lower than 750° C.

4. The method of claim 1, wherein a precursor gas of the group-V element and a precursor gas of the group-III element are injected into the reactor and wherein the ratio of the flow of precursor gas of the group-V element to the flow of precursor gas of the group-III element, called V/III ratio, varies from a first value of the V/III ratio to a second value of the V/III ratio greater than the first value of the V/III ratio.

5. The method of claim 4, wherein the first value of the V/III ratio is smaller than 300 and wherein the second value of the V/III ratio is greater than 500.

6. The method of claim 1, wherein the pressure in the reactor is taken, along the continuous growth of the portions, from a first pressure value to a second pressure value lower than the first pressure value.

7. The method of claim 6, wherein the first pressure value is higher than 53 kPa, and wherein the second pressure value is lower than 40 kPa.

8. The method of claim 1, wherein hydrogen and nitrogen are injected into the reactor and wherein the ratio of the hydrogen flow to the nitrogen flow, called H2/N2 ratio, varies from a first value of the H2/N2 ratio to a second value of the H2/N2 ratio greater than the first value of the H2/N2 ratio.

9. The method of claim 8, wherein the first value of the H2/N2 ratio is smaller than 40/60, and wherein the second value of the H2/N2 ratio is greater than 60/40.

10. The method of claim 1, wherein the active areas are the areas having most the radiation supplied by the optoelectronic device (50) emitted therefrom or having most the radiation received by the optoelectronic device captured therein.

11. The method of claim 1, wherein the III-V compound is a III-N compound, particularly selected from the group comprising gallium nitride, aluminum nitride, indium nitride, gallium indium nitride, gallium aluminum nitride, aluminum indium nitride, and gallium aluminum indium nitride.

12. The method of claim 1, wherein the portion has a uniform composition.

* * * * *